United States Patent [19]
Hodgson

[11] 4,109,174
[45] Aug. 22, 1978

[54] DRIVE CIRCUITS FOR A PIEZOELECTRIC STACK

[75] Inventor: Duncan Barry Hodgson, Whitnash near Leamington Spa, England

[73] Assignee: Lucas Industries Limited, Birmingham, England

[21] Appl. No.: 765,645

[22] Filed: Feb. 4, 1977

[30] Foreign Application Priority Data

Feb. 24, 1976 [GB] United Kingdom ............... 7157/76

[51] Int. Cl.² .......................................... H01L 41/10
[52] U.S. Cl. .................................................. 310/316
[58] Field of Search ................................. 310/316–318

[56] References Cited
U.S. PATENT DOCUMENTS

| | | | |
|---|---|---|---|
| 2,398,701 | 4/1946 | Firestone | 310/317X |
| 3,100,886 | 8/1963 | Marks | 310/317 X |
| 3,524,082 | 8/1970 | Mettler | 310/316 |
| 3,872,330 | 3/1975 | Miler et al. | 310/316 |

Primary Examiner—Mark O. Budd

[57] ABSTRACT

A drive circuit for a piezo-electric crystal stack comprises an inductor, a first circuit including a diode and a transistor through which the inductor can be connected to a pair of d.c. supply terminals, the first circuit including a switch operable to reduce the current flow through the inductor, a second curcuit including a diode through which energy from the inductor is transferred to the stack of crystals when the current flow through the inductor is reduced. The drive circuit also includes means for transferring energy from the stack of crystals to the inductor when it is required to increase current flow in the inductor.

16 Claims, 7 Drawing Figures

DRIVE CIRCUITS FOR A PIEZOELECTRIC STACK

This invention relates to a drive circuit for a piezo electric crystal stack and has for its object to provide such a circuit in a simple and convenient form.

According to the invention a drive circuit for a piezo electric crystal stack comprises an inductor, a first circuit through which said inductor can be connected across a D.C. supply to establish a current flow therethrough, said first circuit including means for rapidly reducing the current flowing to the inductor from the source of supply, a second circuit through which energy is transferred to said crystal stack from the inductor when the current flowing from the source of supply is reduced, and means for transferring energy to the inductor from the crystal stack when it is required to increase the current flow in the inductor.

According to a further feature of the invention said first circuit includes a diode in series with said inductor.

According to a further feature of the invention said second circuit comprises a further diode connected in series with the stack, the stack and said further diode being connected in parallel with the first mentioned diode and the inductor.

According to a further feature of the invention the means for transferring energy comprises a thyristor.

BRIEF DESCRIPTION OF THE DRAWINGS

With reference to FIG. 1 terminals 10, 11 are provided for connection to the positive and negative terminals of a source of D.C. supply. Also provided is a diode 12 having its anode connected to terminal 10 and its cathode connected to one end of an inductor 13 the other end of which is connected to the collector of an N-P-N transistor 14 the emitter of which is connected to terminal 11 by way of a resistor 15.

Figure 1:
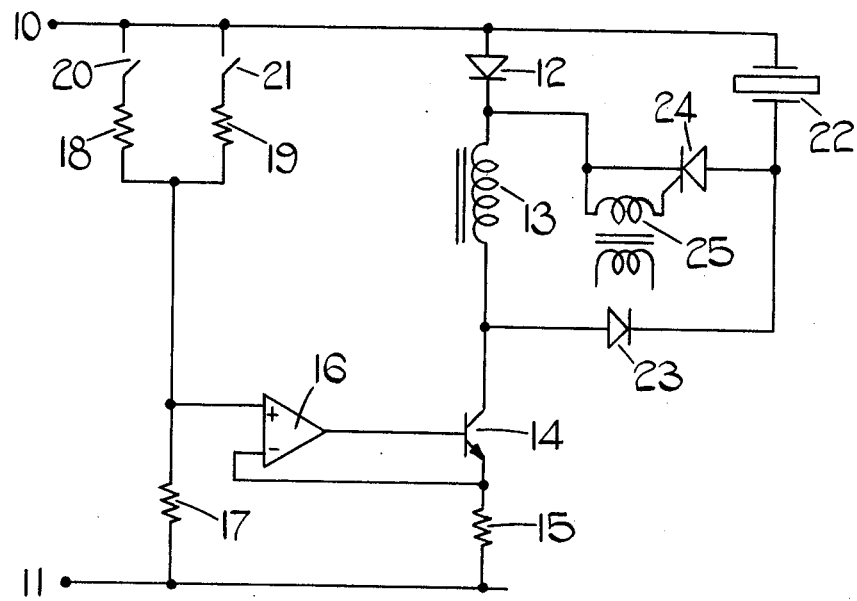
FIGS. 1-7 show examples of the drive circuits in accordance with the invention.

The base of the transistor is connected to the output terminal of an amplifier 16 which is powered from the terminals 10, 11 and which has one input connected to the emitter of the transistor and its other input connected to terminal 11 by way of a resistor 17. Moreover, said other input terminal of the amplifier can be connected to terminal 11 by way of a resistor 17. Moreover, said other input of the amplifier can be connected to terminal 10 by way of one or both of a pair of resistors 18, 19. Switches 20, 21 being provided to achieve this connection.

The crystal stack is indicated at 22 and one plate is connected to the terminal 10 whilst the other plate is connected to the cathode of a diode 23 the anode of which is connected to the collector of the transistor. Furthermore, the aforesaid other plate of the stack is connected to the anode of a thyristor 24 the cathode of which is connected to the cathode of the diode 12. Moreover a firing circuit is provided for the thyristor this comprising a pulse transformer 25.

The drive circuit is intended to provide for substantially zero charge on the crystal stack together with two levels of charge.

The operation of the circuit will be considered starting from the point in time at which both switches 20, 21 are closed and the crystal stack 22 is discharged. With switches 20, 21 closed a voltage is developed across resistor 17 by potentiometer action and the amplifier 16 supplies current to the base of the transistor which is thereby rendered conductive. The resulting current flow in diode 12, inductor 13 and the transistor 14 and resistor 15 builds up until the voltage developed across the resistor 15 is equal to that developed across resistor 17. If for example switch 21 is now opened the voltage developed across resistor 17 falls and the transistor stops conducting. Diode 23 now conducts and energy is transferred to the crystal stack from the inductor. The current flowing in the inductor falls until the transistor again starts to conduct at a lower level of current determined by the voltage across resistor 17. The crystal stack is therefore charged to a first voltage level.

If the other switch is now opened the process is repeated and the crystal stack is charged to a second and higher voltage level. In this case however, the current in the inductor falls to zero, because no voltage is developed across resistor 17.

In order to revert to the original state, both switches are closed and at the same time the thyristor 24 is fired. The crystal stack now discharges through the thyristor and since the stack is effectively connected in series with the D.C. supply, a rapid rise in the current flow in the inductor takes place. When diode 12 starts to conduct the thyristor ceases to conduct and therefore turns off. The energy in the crystal stack is therefore utilized to speed up the rate of increase of current flow in the inductor and therefore enables the circuit to operate at a higher frequency.

The crystal stack in the present example is utilized to operate a piston which constitutes a pressure generator for operating a pair of pressure responsive valves. The valves operate at differing pressures and serve to control the flow of motive fluid to and from one end of a cylinder containing an actuating piston forming part of the fuel system of an internal combustion engine.

It will be understood that in a practical circuit the switches 20, 21 will be electronic switches which are embodied in a control circuit of the fuel system. The control circuit is also arranged to provide the firing pulse for the thyristor.

Figure 2:
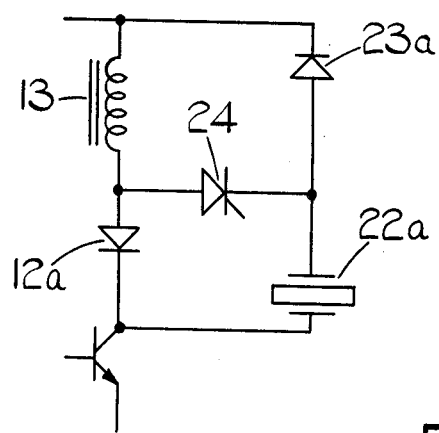

In FIG. 2 there is shown one alternative arrangement of the circuit where the positons of the diode 12a and the inductor 13 are reversed as also are the positions of the crystal stack 22a and diode 23a.

Figure 3:
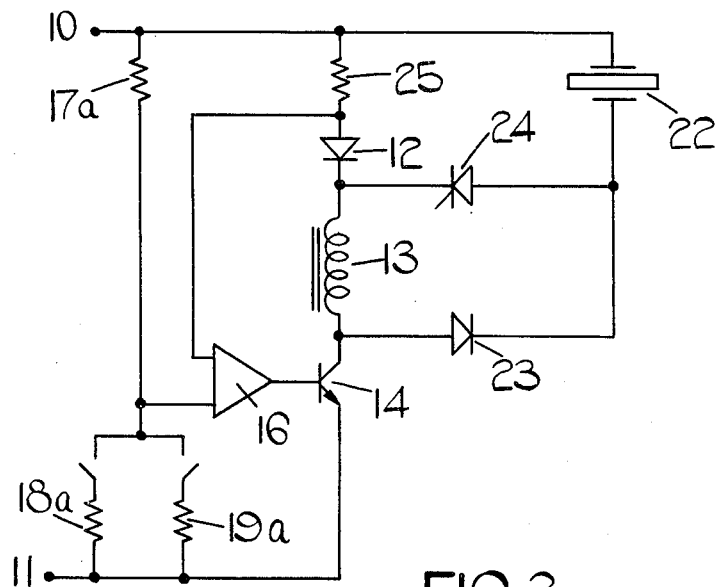

FIG. 3 shows a further alternative to the circuit of FIG. 1 and in which the resistor in series with the collector emitter path of the transistor is placed at another position in the series circuit. As will be seen the resistor 25 is positioned between the terminal 10 and the diode 12. The inputs to the amplifier 16 are also changed as also are the positions of the resistors 17a, 18a, 19a in the chain between the input terminals 10 and 11.

Figures 4, 5:
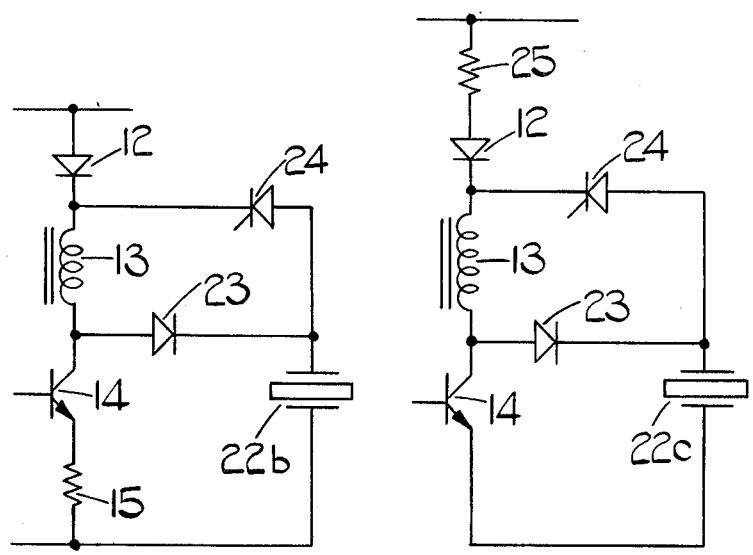

FIGS. 4 and 5 show alternative positions for the stack of crystals 22b, 22c as compared with the circuits shown in FIGS. 1 and 3. This enables one plate of the stack of crystals to be at earth potential if the circuit is used in a negative earth system.

Figure 6:
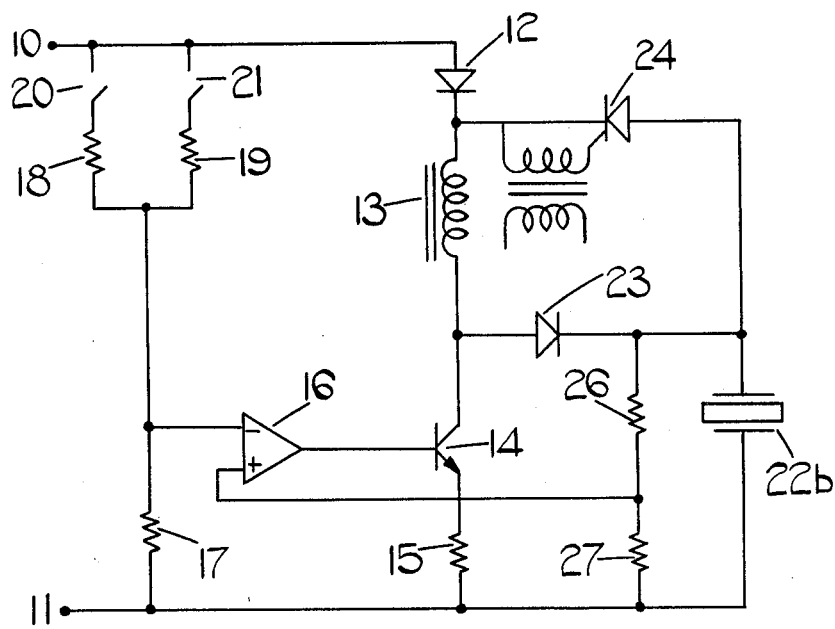

FIG. 6 shows an alternative to the circuit of FIG. 4. In this case the amplifier has one input connected to a point intermediate the resistor 17 and the two resistors 18, 19 and its other input connected to a point intermediate a pair of series connected resistors, 26, 27 connected in parallel with the stack of crystals 22b. The voltage at the junction of resistors 26, 27 is therefore compared by the amplifier 16 with the voltage as set by the switches 20, 21. Moreover, the bias on amplifier 16 is arranged so that with the stack discharged and switches 20 and 21 open, transistor 14 will conduct and current flow will take place in the inductor.

If switch 20 is now closed the transistor will cease to conduct and energy transfer will take place to the crystal stack. The voltage across the crystal stack will rise until the two input voltages applied to the amplifier are equal at which point in time the transistor will start to conduct and further transfer of energy between the inductor and stack will cease.

If switch 21 is now closed a further transfer of energy will occur. When it is required to discharge the stack of crystals switches 20, 21 are opened and the thyristor is fired, again the discharge of the stack acts to speed up the rate of increase in the current flowing in the inductor.

Figure 7:
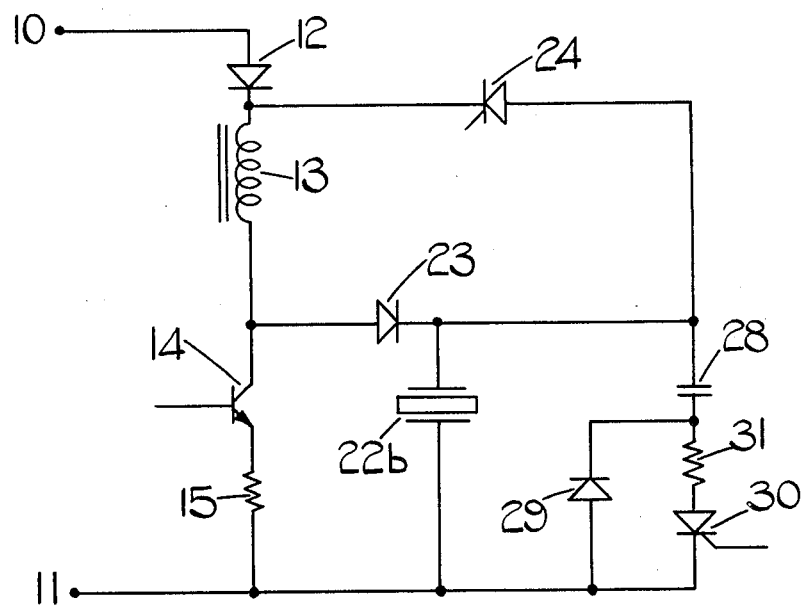

In FIG. 7 there is shown a circuit arrangement which is a modification of the circuit shown in FIG. 4 but which enables the stack 22b to be discharged in two stages. Connected in parallel with the stack is the series circuit of a capacitor 28, a resistor 31 and a further thyristor 30 having its cathode connected to terminal 11. Moreover, a point intermediate the capacitor 28 and resistor 31 is connected to the cathode of a diode 29 having its anode connected to terminal 11.

With the stack 22b charged to its higher level if thyristor 30 is fired then the stack will be discharged into the capacitor 28. As a result the overall charge will be substantially the same but the charge on the stack will be reduced. The resistor 31 acts to limit the current flow and when the charge sharing is complete the thyristor 30 will cease to conduct. When complete discharge of the stack is required the switches 20 and 21 are opened and the thyristor 24 is fired. The final discharge of the stack also effecs discharge of the capacitor 28 by way of the diode 29.

The circuits described enable rapid charge and discharge of the stack of crystals to be effected. Moreover, the energy required to charge the stack is not lost during the discharge process since it is used to increase the rate at which the increase in current flow in the inductor takes place. It will be appreciated that there will be some loss of energy in the circuit components due to resistive loss.

I claim:

1. A drive circuit for a piezo-electric crystal stack comprising an inductor, a first circuit through which said inductor can be connected across a D.C. supply to establish a current flow therethrough, said first circuit including means for rapidly reducing the current flowing to the inductor from the source of supply, a second circuit through which energy is transferred to said crystal stack from the inductor when the current flowing from the source of supply is reduced, and means for transferring energy to the inductor from the crystal stack when it is required to increase the current flow in the inductor.

2. A drive circuit for a piezoelectric crystal stack comprising an inductor, a first circuit through which said inductor can be connected across a d.c. supply to establish a current flow therethrough, a second conduit through which energy is transferred to said crystal stack from the inductor when the current flowing from the source of supply is reduced means for transferring energy to the inductor from the crystal stack when it is required to increase the current flow in the inductor, said first cirucit including a diode connected in series with the inductor and further means connected in series with said diode and inductor for controlling the current flow through the inductor from said source of supply.

3. A drive circuit according to claim 2 in which said further means includes a transistor having its collectoremitter path connected in series with said inductor, and switch means operable to vary the current flow in said transistor.

4. A drive circuit according to claim 3 including an amplifier for supplying base current to said transistor, said amplifier having a pair of inputs one of which is controlled by said switch means.

5. A drive circuit according to claim 4 in which said switch means comprises a pair of switches operable to provide at least three voltage levels at said one input of the amplifier.

6. A drive circuit according to claim 4 in which the other input of the amplifier is connected to a point in said first circuit the voltage of which varies in accordance with the current flow in the inductor.

7. A drive circuit according to claim 6 including a resistor in said first circuit, said resistor having one end connected to one of said pair of terminals and its other end to the remaining portion of the first circuit, said other end of the resistor being connected to said other input of the amplifier.

8. A drive circuit according to claim 4 in which the other of said inputs of the amplifier is connected to a point intermediate a pair of resistors connected in parallel with said stack of crystals.

9. A drive circuit according to claim 2 in which said second circuit includes a further diode poled to allow charging of the stack of crystals when the current flow through the inductor is reduced.

10. A drive circuit according to claim 9 in which the charging current of the crystals flows through said first mentioned diode.

11. A drive circuit according to claim 2 in which said means for transferring energy to the inductor comprises a thyristor, and means is provided for firing said thyristor when it is required to substantially discharge the stack of crystals.

12. A drive circuit according to claim 11 in which said thyristor is connected between one terminal of the stack of crystals and a point intermediate said first mentioned diode and the inductor, the other terminal of the stack being connected to one of said pair of terminals.

13. A drive circuit according to claim 2 including means operable to reduce the charge on said stack of crystals.

14. A drive circuit according to claim 13 in which the means operable to reduce the charge comprises a capacitor and a further thyristor in series with said capacitor, said further thyristor and capacitor being connected in parallel with the stack of crystals, and means for firing said further thyristor whereby the stack of crystals shares its charge with the capacitor.

15. A drive circuit according to claim 14 including a diode in parallel with said further thyristor, whereby when the means for transferring energy is operated, the charge on said capacitor is also utilised to increase the current flow in the inductor.

16. A drive according to claim 15 including a resistor in series with said further thyristor.

* * * * *